(12) United States Patent
Lee et al.

(10) Patent No.: US 10,453,902 B2
(45) Date of Patent: Oct. 22, 2019

(54) ORGANIC LIGHT EMITTING DIODE DISPLAY DEVICE AND METHOD FOR MANUFACTURING THE SAME

(71) Applicant: LG DISPLAY CO., LTD., Seoul (KR)

(72) Inventors: Kang Ju Lee, Goyang-si (KR); Hun Bae Im, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/105,980

(22) Filed: Dec. 13, 2013

(65) Prior Publication Data

US 2014/0183480 A1     Jul. 3, 2014

(30) Foreign Application Priority Data

Dec. 31, 2012 (KR) .................. 10-2012-0158493

(51) Int. Cl.
   *H01L 27/32* (2006.01)
   *H01L 51/50* (2006.01)
   *H01L 51/52* (2006.01)

(52) U.S. Cl.
   CPC ........ *H01L 27/322* (2013.01); *H01L 27/3213* (2013.01); *H01L 51/5012* (2013.01); *H01L 51/5265* (2013.01); *H01L 51/5284* (2013.01)

(58) Field of Classification Search
   CPC ............... H01L 27/322; H01L 27/3213; H01L 51/5012; H01L 51/5265; H01L 51/5284
   See application file for complete search history.

(56) References Cited

U.S. PATENT DOCUMENTS

| 6,137,819 | A | * | 10/2000 | Najda | H01L 33/105 257/E33.069 |
|---|---|---|---|---|---|
| 7,023,013 | B2 | | 4/2006 | Ricks et al. | |
| 2006/0238119 | A1 | * | 10/2006 | Spindler | H01L 27/322 313/506 |
| 2007/0069635 | A1 | * | 3/2007 | Cok | H01L 27/322 313/504 |

(Continued)

FOREIGN PATENT DOCUMENTS

| CN | 101132020 A | 2/2008 |
|---|---|---|
| CN | 102610630 A | 7/2012 |

(Continued)

OTHER PUBLICATIONS

Office Action for corresponding Chinese Application No. 201310661412.5, dated Feb. 1, 2016, 8 pages.

*Primary Examiner* — Meiya Li
(74) *Attorney, Agent, or Firm* — Seed Intellectual Property Law Group LLP (57) ABSTRACT

An OLED display device which prevents a color change according to a viewing angle. The OLED display device may include a substrate defined by a first pixel, a second pixel, a third pixel and a fourth pixel; an anode electrode on the substrate; a first organic light-emitting layer for emitting a first color light; a second organic light-emitting layer for emitting a second color light; a cathode electrode formed of a semi-transparent metal material on the first or second organic light-emitting layer, wherein the first organic light-emitting layer is formed in the first pixel and the second pixel; the second organic light-emitting layer is formed in the second pixel, the third pixel and the fourth pixel; and the second pixel emits mixed light of the first color light and the second color light.

17 Claims, 4 Drawing Sheets

(56) References Cited

U.S. PATENT DOCUMENTS

| | | | |
|---|---|---|---|
| 2007/0102693 A1* | 5/2007 | Nagai | F21K 9/00 257/13 |
| 2009/0026969 A1* | 1/2009 | Joo | G09G 3/2022 315/169.3 |
| 2009/0212696 A1 | 8/2009 | Terao | |
| 2012/0242218 A1* | 9/2012 | Yoshinaga | H01L 27/3213 313/504 |
| 2012/0248973 A1 | 10/2012 | Ito et al. | |
| 2013/0062596 A1* | 3/2013 | Ando | H01L 51/56 257/40 |
| 2013/0140533 A1* | 6/2013 | Lee | H01L 51/5265 257/40 |
| 2013/0147689 A1* | 6/2013 | Liu | G09G 3/30 345/76 |

FOREIGN PATENT DOCUMENTS

| | | |
|---|---|---|
| CN | 102694001 A | 9/2012 |
| EP | 1 875 509 B1 | 6/2010 |
| JP | 2007-265859 A | 10/2007 |
| KR | 10-2009-0092698 A | 9/2009 |
| KR | 10-2012-0104245 A | 9/2012 |

* cited by examiner

Red open area

Green open area

Blue open area

PX arrangement

R  G  B

ORGANIC LIGHT EMITTING DIODE DISPLAY DEVICE AND METHOD FOR MANUFACTURING THE SAME

CROSS REFERENCE TO RELATED APPLICATIONS

This application claims the benefit of priority to Korean Patent Application No. 10-2012-0158493 filed on Dec. 31, 2012, which is hereby incorporated by reference as if fully set forth herein.

BACKGROUND

Field of the Disclosure

Embodiments of the present invention relate to an organic light emitting diode display device and a method for manufacturing the same, and more particularly, to an active type organic light emitting diode display device and a method for manufacturing the same.

Discussion of the Related Art

With the advancement of an information-oriented society, there is an increasing demand for display devices which display information. Especially, a cathode ray tube (CRT) having a simple driving method and a reasonable price was widely used in an early stage of the display device, thereby enabling popularization of the display device. Thereafter, a liquid crystal display (LCD) device capable of realizing full colors and wide viewing angle was used as a substitute for CRT. Recently, an organic light emitting diode (OLED) display device has been attracted as a next-generation flat panel display.

Owing to various advantages such as high resolution, thin profile and low power consumption, there is an active study for the OLED display device regarded as the next-generation flat panel display, and more particularly, for the large-sized OLED display device.

Figure 1:
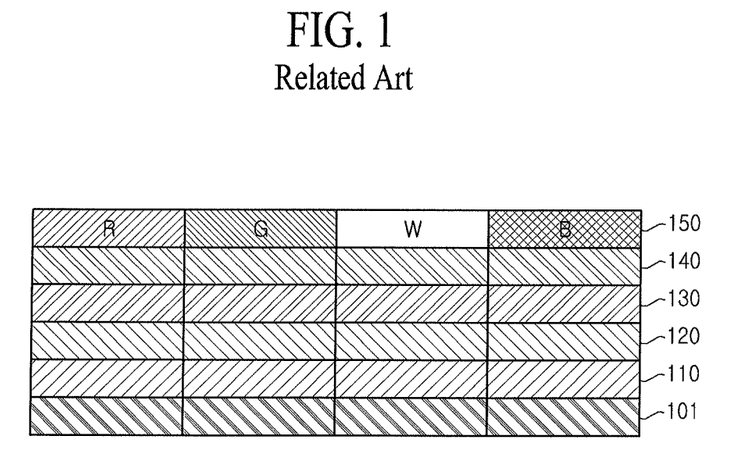
FIG. 1 is a cross sectional view illustrating a related art OLED display device.

FIG. 1 is a cross sectional view illustrating some parts of the related art OLED display device.

As shown in FIG. 1, the related art OLED display device may include a substrate 101, an anode electrode 110, an organic light-emitting layer 120, a cathode electrode 130, a sealing layer 140, and a color refiner 150.

First, the anode electrode 110, the organic light-emitting layer 120 and the cathode electrode 130 are sequentially formed on the substrate 101. The anode electrode 110 supplies a hole to the organic light-emitting layer 120, and the cathode electrode 130 supplies an electron to the organic light-emitting layer 120. Thus, when exciton, which is generated by the supplied hole and electron, falls to a ground state from an excited state, light is emitted so that the emitted light is supplied to display an image on a screen of the OLED display device.

FIG. 1 shows the OLED display device of WRGB method with the color refiner 150 for converting a color of white color light into red, green and blue colors corresponding to the three primary colors. The color refiner 150 is formed on the sealing layer 140 above the cathode electrode 130, and the color refiner 150 may not be formed in the pixel for emitting the white color light.

Especially, the organic light-emitting layer 120 may include one or more light-emitting layers, and the organic light-emitting layer 120 may emit the white color light obtained by mixture of red, green and blue colors.

Meanwhile, the OLED display device is configured to have a multi-layered thin film structure, whereby a large amount of light loss might occur in the interface between each layer. In order to overcome this problem and to improve light extraction efficiency, a microcavity structure may be applied to the OLED display device. The microcavity structure indicates a reflection structure which satisfies an optical distance corresponding to an integer multiple of half-wavelength of the light emitted by each pixel. In this reflection structure, the light reflection is repeated so that the light is amplified by constructive interference, whereby the amplified light is emitted to the external, thereby improving light efficiency as compared to the related art.

However, when the white color light emitted by the organic light-emitting layer 120 including the plurality of light-emitting layers is amplified through the microcavity structure, and is then emitted to the external, the color of light may be changed according to a viewing angle due to a plurality of peak wavelengths.

SUMMARY

An OLED display device that may include a substrate defined by a first pixel, a second pixel, a third pixel and a fourth pixel; an anode electrode formed on the substrate; a first organic light-emitting layer for emitting a first color light, the first organic light-emitting layer formed on the anode electrode; a second organic light-emitting layer for emitting a second color light, the second organic light-emitting layer formed on the anode electrode; and a cathode electrode formed of a semi-transparent metal material on the first organic light-emitting layer or second organic light-emitting layer, wherein the first organic light-emitting layer is formed in the first pixel and the second pixel, the second organic light-emitting layer is formed in the second pixel, the third pixel and the fourth pixel, and the second pixel emits mixed light of the first color light and the second color light.

In another aspect, a method for manufacturing an OLED display device may include forming a reflection layer on a substrate; forming an anode electrode on the reflection layer; forming a first organic light-emitting layer on the anode electrode; forming a second organic light-emitting layer on the anode electrode, wherein the second organic light-emitting layer overlaps with the first organic light-emitting layer; and forming a cathode electrode on the first organic light-emitting layer or second organic light-emitting layer.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Hereinafter, embodiments of the present invention will be described in detail with reference to the accompanying drawings.

Figure 2:
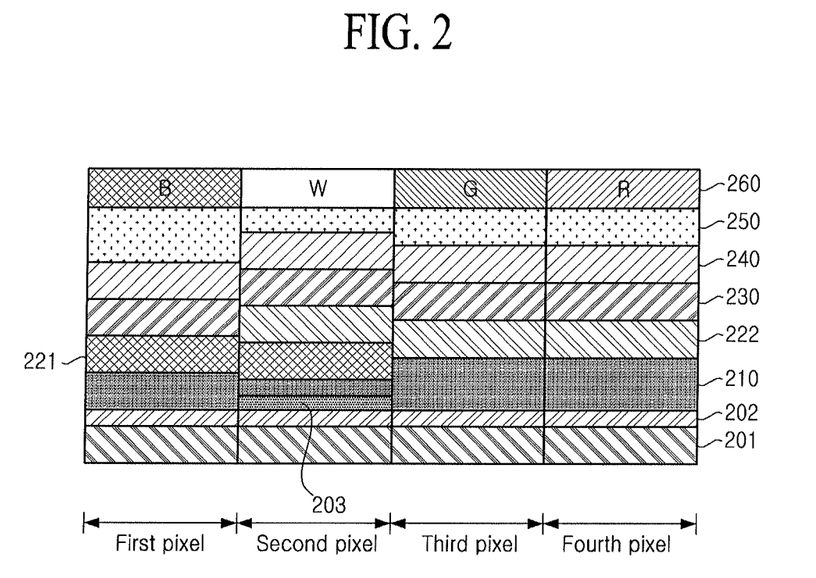
FIG. 2 is a cross sectional view illustrating an OLED display device according to one embodiment of the present invention.

FIG. 2 is a cross sectional view illustrating an OLED display device according to one embodiment of the present invention.

As shown in FIG. 2, the OLED display device according to one embodiment of the present invention may include a substrate 201, a reflection layer 202, a light-absorbing layer 203, an anode electrode 210, a first organic light-emitting layer 221, a second organic light-emitting layer 222, a cathode electrode 230, a protection layer 240, a sealing layer 250, and a color refiner 260.

First, the substrate 201 may be defined by a first pixel, a second pixel, a third pixel, and a fourth pixel. For example, as shown in FIG. 2, the first pixel may be defined as a blue pixel with a blue color refiner (B), the second pixel may be defined as a white pixel with a transparent color refiner or without a color refiner, the third pixel may be defined as a green pixel with a green color refiner (G), and the fourth pixel may be defined as a red pixel with a red color refiner (R), but not limited to this structure. The pixels may vary in arrangement.

The substrate 201 may be formed of glass or flexible plastic, for example, polyimide, polyetherimide (PEI), polyethyeleneterepthalate (PET), and etc.

The reflection layer 202 may be formed on the substrate 201. The reflection layer 202 corresponds to an area, on which light is emitted in a direction of anode electrode 210, in a microcavity structure, and the microcavity structure is capable of being applied to most of the pixels. Preferably, the reflection layer 202 be formed on the entire area of the substrate 201. The reflection layer 202 may be formed between the anode electrode 210 and a thin film transistor (not shown). Also, it is preferable that the reflection layer 202 be formed of metal with high reflectance and conductivity, for example, argentum (Ag) or aluminum (Al).

When a thickness of the metal such as argentum (Ag) or aluminum (Al) is not more than several-hundred angstrom (Å), the metal shows the transflective properties which reflects and simultaneously transmits light. Thus, in order to reflect most of the light, the reflection layer 202 is formed at a thickness capable of removing the transflective properties. Preferably, the thickness of reflection layer 202 may be in a unit of micrometer (μm).

Then, the light-absorbing layer 203 is formed on the reflection layer 202. The light-absorbing layer 203 may be formed in the second pixel for emitting white color light to the external. The white color light includes wavelength ranges corresponding to all visible rays. Thus, only the light, which has a predetermined wavelength corresponding to an integer multiple of optical distance and half-wavelength of the microcavity structure, is amplified and then emitted to the external. Accordingly, since the white color light is distorted and then emitted to the external, it is difficult to apply the microcavity structure to the second pixel for emitting the white color light to the external. The light-absorbing layer 203 is formed in the second pixel for emitting the white color light to the external, which enables light absorption or light extinction without reflection of the white color light emitted in the direction of the anode electrode 210.

In order to prevent the reflection of the white color light, the light-absorbing layer 203 is formed of a material whose reflectance is less than about 10%, preferably. Also, the light-absorbing layer 203 is formed of a material whose optical density (OD) is not more than 3.5, preferably.

Then, the anode electrode 210 is formed on the entire area of the substrate 201 including the reflection layer 202 and the light-absorbing layer 203. A thickness of the anode electrode 210 may be different for each pixel. The optical distance of the microcavity structure may vary according to the wavelength of the light emitted by each pixel. The optical distance may be adjusted by the thickness of the anode electrode 210. The microcavity structure is not used in the second pixel for emitting the white color light, whereby the thickness of the anode electrode 210 may be appropriately determined regardless of the optical distance. In case of the first pixel for emitting the blue color light, the relatively-short optical distance is set because the blue color light has the relatively-short wavelength, whereby the thickness of the anode electrode 210 for the first pixel may be relatively short.

Meanwhile, the optical distance may be identically set for each of the third and fourth pixels. The distance corresponding to the least common multiple of the half-wavelength of red color light and the half-wavelength of green color light is shorter than the thickness of pixel region. Thus, the thickness of the anode electrode 210 for the third pixel may be the same as the thickness of the anode electrode 210 for the fourth pixel, and the thickness of the anode electrode 210 for each of the third and fourth pixels may be larger than the thickness of the anode electrode 210 for the first pixel. However, it is not limited to this structure. That is, the optical distance may vary, and the anode electrode 210 may vary in thickness.

The anode electrode 210 is formed of a material whose work function is large so as to supply a hole. For example, the anode electrode 210 may be formed of a conductive oxide material whose work function is high, wherein the conductive oxide material may be a transparent material, for example, Indium Tin Oxide (ITO), Indium Zinc Oxide (IZO) or Indium Tin Zinc Oxide (ITZO).

A lower surface of the anode electrode 210 is connected with the thin film transistor (not shown), and an upper surface of the anode electrode 210 is connected with the first organic light-emitting layer 221 and the second organic light-emitting layer 222, to thereby provide the hole from the thin film transistor to the first organic light-emitting layer 221 and the second organic light-emitting layer 222. The thin film transistor may be a driving thin film transistor.

Then, the first organic light-emitting layer 221 is formed on the anode electrode 210. The first organic light-emitting layer 221 may be formed in at least one pixel including the second pixel for emitting the white color light. For example, as shown in FIG. 2, the first organic light-emitting layer 221 may be formed in the first pixel and the second pixel. Preferably, the first organic light-emitting layer 221 is formed of a material for emitting a blue color, but not limited to the blue color.

At least one function layer (not shown) may be interposed between the first organic light-emitting layer 221 and the anode electrode 210. The function layer improves mobility of the hole from the anode electrode 210 to the first organic light-emitting layer 221. For example, the function layer may be a hole injection layer (not shown) and a hole transport layer (not shown). Preferably, these function layers are formed of the material whose hole mobility is relatively higher.

Then, the second organic light-emitting layer 222 is formed on the anode electrode 210. The second organic light-emitting layer 222 may be formed in at least one pixel including the second pixel for emitting the white color light. In the second pixel, the first organic light-emitting layer 221 and the second organic light-emitting layer 222 may overlap with each other. Preferably, the second organic light-emitting layer 222 is formed of the material for emitting yellow color light, wherein the yellow color light enables to emit the white color light when it is mixed with the blue color light. However, the colors of light emitted from the first organic light-emitting layer 221 and the second organic light-emitting layer 222 are not limited to the above-described colors. If the conditions that the white color light is made by mixing the first color light emitted from the first organic light-emitting layer 221 and the second color light emitted from the second organic light-emitting layer 222 are satisfied, it is possible to provide any mixture of the colored lights.

At least one function layer may be further interposed between the first organic light-emitting layer 221 and the second organic light-emitting layer 222. That is, a function layer for improving mobility of hole and electron or a charge control layer may be interposed so as to transport the hole, which remains after the emission of the first organic light-emitting layer 221, to the second organic light-emitting layer 222, and also to transport the electron, which remains after the emission of the second organic light-emitting layer 222, to the first organic light-emitting layer 221. Preferably, the hole transport layer may be positioned adjacent to or may be brought into contact with the second organic light-emitting layer 222 provided adjacent to the cathode electrode 230. Meanwhile, the electron transport layer may be positioned adjacent to or may be brought into contact with the first organic light-emitting layer 221 provided adjacent to the anode electrode 210.

As mentioned above, the first organic light-emitting layer 221 and the second organic light-emitting layer 222 are overlapped with each other only in the second pixel for emitting the white color light, and the single light-emitting layer is positioned in each of the remaining pixels, to thereby preventing a color change according to a viewing angle, and showing microcavity effects.

Then, the cathode electrode 230 is formed on the first organic light-emitting layer 221 and the second organic light-emitting layer 222. For the above-described emission method, the cathode electrode 230 is formed of the transparent material so that the light is emitted from the first organic light-emitting layer 221 and the second organic light-emitting layer 222 to the external. The cathode electrode 230 applies the same voltage to all the pixels, that is, the cathode electrode 230 is referred to as a common electrode. Thus, the cathode electrode 230 may be formed as a single layer for covering the entire area of the substrate without patterning. Also, an auxiliary electrode may be provided and connected with an upper side or lower side of the cathode electrode 230 so as to prevent driving problems caused by the increase of resistance, to thereby reduce the resistance.

The cathode electrode 230 may be formed of argentum (Ag), magnesium (Mg), aluminum (Al), copper (Cu), or an alloy including any one of the above materials. Also, the cathode electrode 230 may be formed of metal materials with low work function, or their alloys. In order to emit the light to the external, the cathode electrode 230 is formed of a thin film type, that is, the cathode electrode 230 has a thickness which is not more than several-hundred angstrom (Å).

The cathode electrode 230 again reflects the light, which is reflected on the reflection layer 202, toward the anode electrode 210, whereby the reflection of light emitted from the corresponding pixel is repeated so that the light amplified by the constructive interference is emitted to the external. Through the above microcavity effects, it is possible to improve light extraction efficiency.

Next, the protection layer 240 is formed on the cathode electrode 230. The protection layer 240 protects the lower structures, which are formed before formation of the sealing layer 250, from the following process, and helps the partial reflection of light emitted from the cathode electrode 230. For example, the protection layer 240 may be formed of silicon nitride (SiNx) or silicon oxide (SiOx).

Then, the sealing layer 250 is formed on the protection layer 240. The sealing layer 250 may include at least one inorganic film and at least one organic film which are alternately deposited, wherein the film confronting the protection layer 240 and the film confronting the color refiner 260 may be formed of the inorganic films. That is, it is possible to provide the structure of the inorganic film for covering the organic film.

Thereafter, the color refiner 260 is formed on the sealing layer 250. According to a manufacturing method of the OLED display device, the additional protection layer 240 or air gap may be positioned between the color refiner 260 and the sealing layer 250.

The color refiner 260 may include the blue color refiner (B) formed in the first pixel, the green color refiner (G) formed in the third pixel, and the red color refiner (R) formed in the fourth pixel. For example, the blue color light is emitted by the first pixel, wherein the blue color refiner (B) is formed to represent the precise color. The second organic light-emitting layer 222 positioned in the third pixel and the fourth pixel emits the yellow color light, wherein the yellow color light is converted into the red color light through the use of red color refiner (R) formed in the third pixel, and the yellow color light is converted into the green color light through the use of green color refiner (G) formed in the fourth pixel.

In case of the second pixel, the white color light, which is obtained by mixing the blue color light and the yellow color light respectively emitted from the first organic light-emitting layer 221 and the second organic light-emitting layer 222, is emitted, wherein the white color refiner (W) is formed of the transparent material, or the color refiner is omitted.

Figure 3:
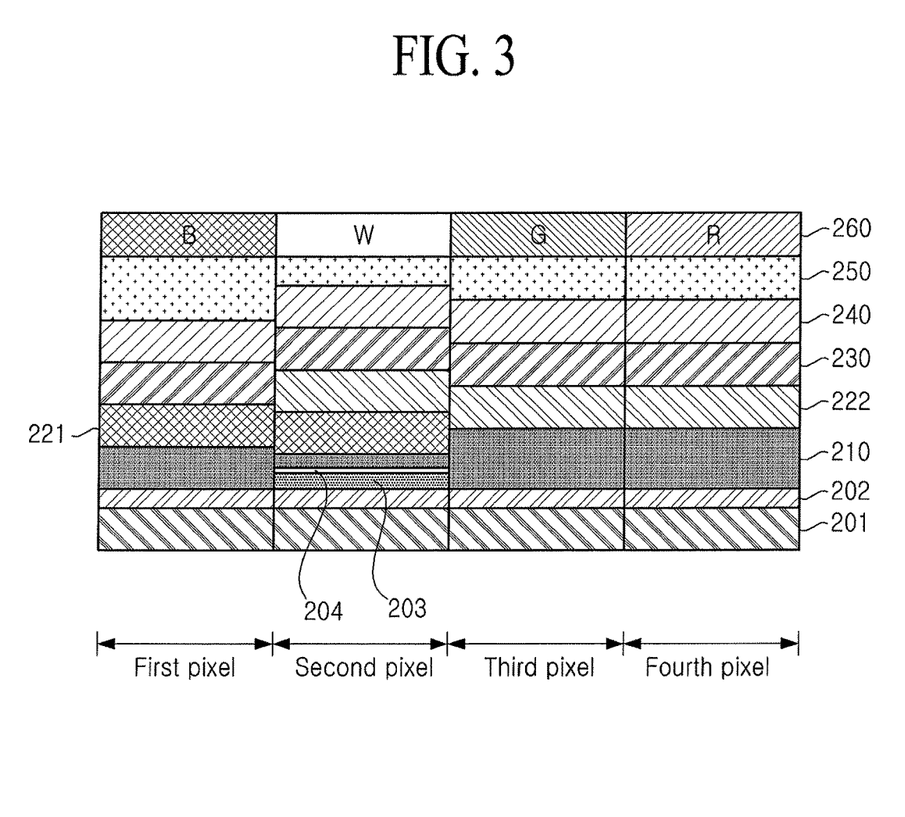
FIG. 3 is a cross sectional view illustrating an OLED display device according to another embodiment of the present invention.

FIG. 3 is a cross sectional view illustrating an OLED display device according to another embodiment of the present invention.

As shown in FIG. 3, the OLED display device according to another embodiment of the present invention may further include a semi-transparent layer 204 which is formed in a second pixel between an anode electrode 210 and a light-absorbing layer 203.

The white color light is emitted by the second pixel. As described above, the pixel for emitting the white color light cannot use the microcavity structure due to distortion of the white color light. However, if the semi-transparent layer 204, which is formed of a semi-transparent material capable of partially reflecting light, is additionally provided or the semi-transparent layer 204, which is formed of a material whose refractive index is relatively higher than that of the surroundings, is additionally provided, the white color light is slightly amplified within a range of preventing distortion during a process for repeating a reflection of the white color light between a cathode electrode 230 and the semi-transparent layer 204, and is then emitted to the external. Accordingly, the semi-transparent layer 204 is additionally interposed so that it is possible to improve luminance.

Figure 4:
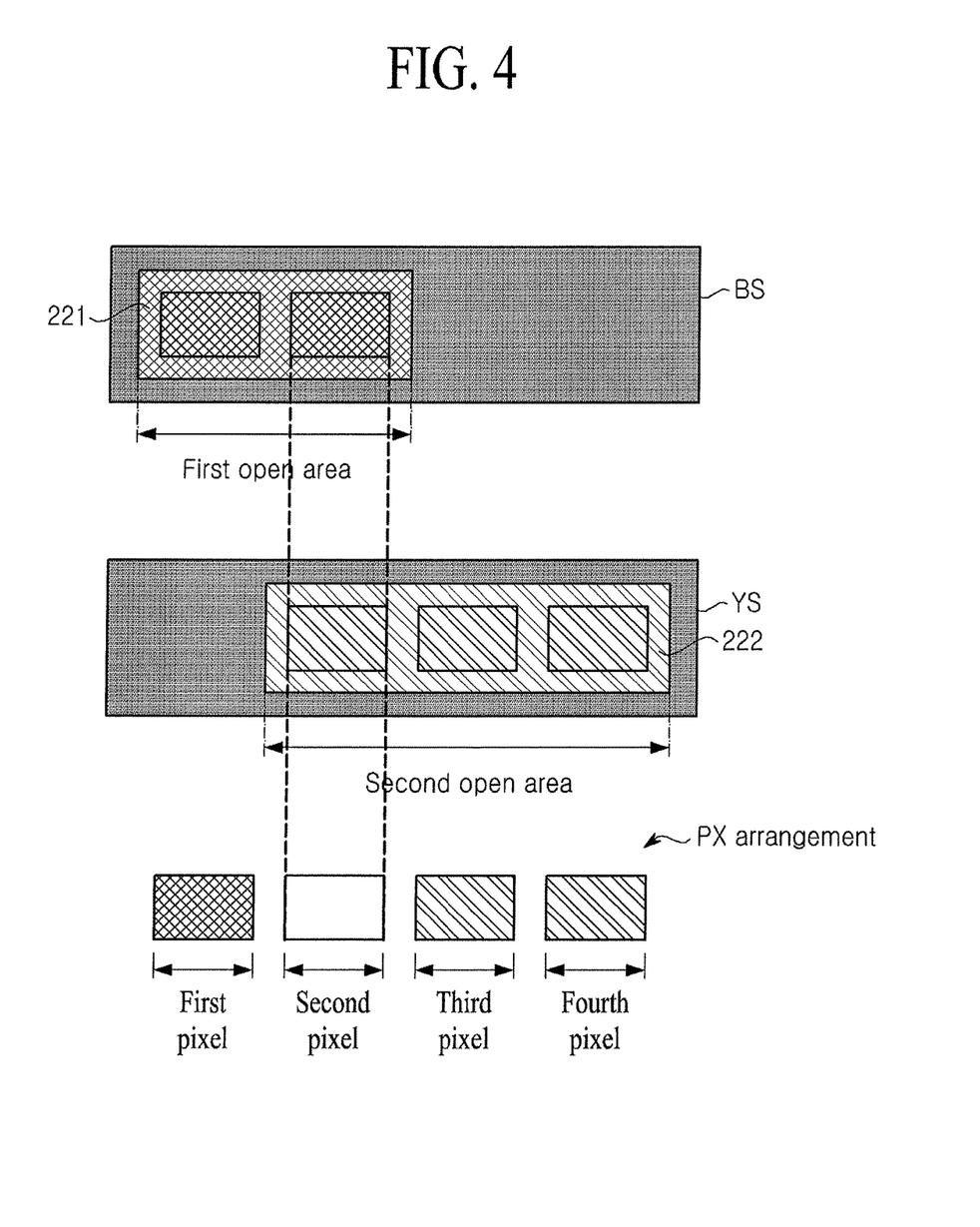
FIG. 4 is a plane view illustrating a process for forming an organic light-emitting layer in a method for manufacturing an OLED display device according to one embodiment of the present invention.

FIG. 4 is a plane view illustrating a shadow mask process during a method for manufacturing the OLED display device according to one embodiment of the present invention.

As shown in FIG. 4, after aligning a blue shadow mask (BS) having a first open area which is relatively larger than an area of the first organic light-emitting layer 221, wherein the blue shadow mask (BS) is overlapped with the first organic light-emitting layer 221 so as to form the first organic light-emitting layer 221 for emitting the blue color light, a material for forming the first organic light-emitting layer 221 is deposited on the first open area.

Then, after aligning a yellow shadow mask (YS) having a second open area which is relatively larger than an area of the second organic light-emitting layer 222, wherein the yellow shadow mask (YS) is overlapped with the second organic light-emitting layer 222 so as to form the second organic light-emitting layer 222 for emitting the yellow color light, a material for forming the second organic light-emitting layer 222 is deposited on the second open area. In the second pixel, the first organic light-emitting layer 221 and the second organic light-emitting layer 222 are overlapped with each other, to thereby emit the white color light obtained by mixing the above blue and yellow colors.

The first open area and the second open area of the shadow mask (BS, YS) are larger than those of the related art so that it is possible to reduce a mask-manufacturing cost, and to facilitate a process for manufacturing the mask.

Figure 5:
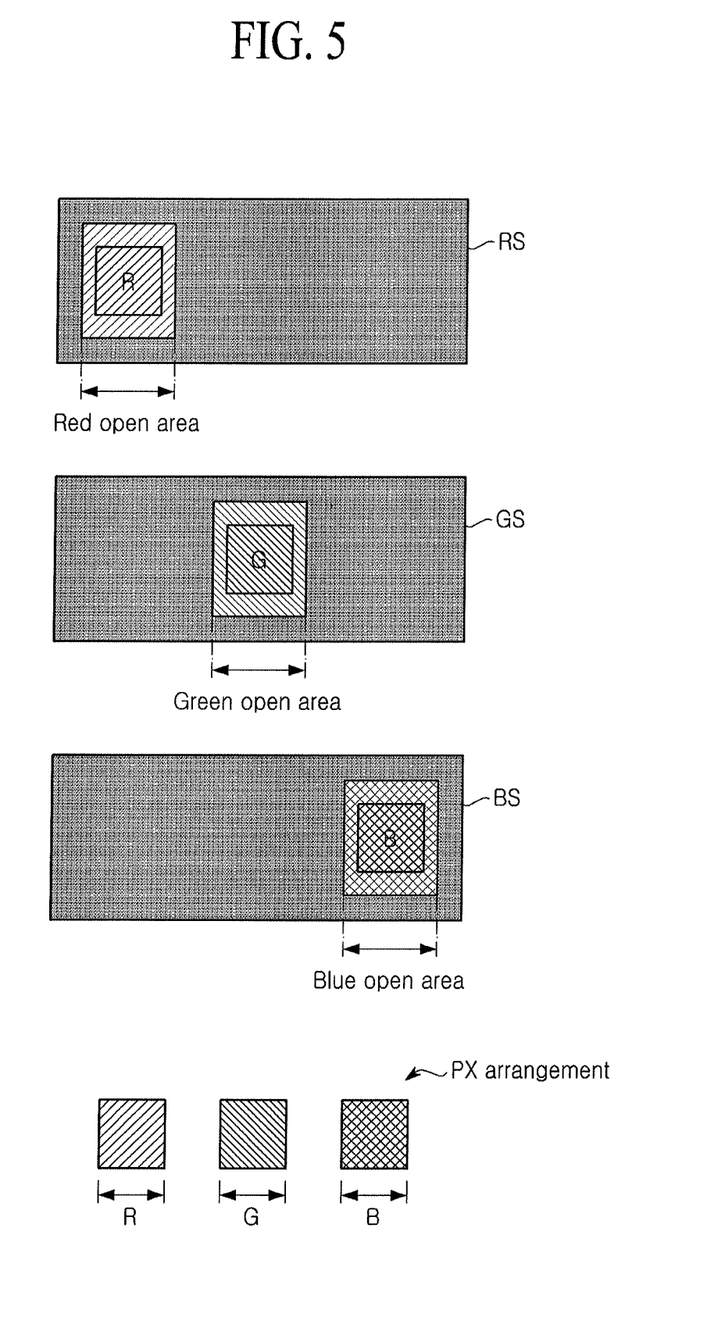
FIG. 5 is a plane view illustrating a process for forming an organic light-emitting layer in a method for manufacturing an OLED display device of RGB method.

FIG. 5 is a plane view illustrating a process for manufacturing a shadow mask of RGB independent deposition method.

As shown in FIG. 5, in case of the RGB independent deposition method, the red pixel (R) is formed by depositing a material for forming a red organic light-emitting layer in a red open area of a red shadow mask (RS), the green pixel (G) is formed by depositing a material for forming a green organic light-emitting layer in a green open area of a green shadow mask (GS), and the blue pixel (B) is formed by depositing a material for forming a blue organic light-emitting layer in a blue open area of a blue shadow mask (BS).

The open area in the shadow mask of RGB independent deposition method is much smaller than the open area of the shadow mask proposed in the method for manufacturing the OLED display device according to one embodiment of the present invention. Thus, if using the shadow mask of RGB independent deposition method, the time and cost for manufacturing the mask is increased, and thus the manufacturing cost is also increased.

However, the shadow mask proposed in the present invention has the open area corresponding to the two or more pixels, whereby it is possible to facilitate the process for manufacturing the mask, and thus to reduce the manufacturing cost.

According to the embodiments of the present invention, the plurality of organic light-emitting layers for emitting the different-color light are partially overlapped so that it is possible to realize the microcavity without the color change according to the viewing angle.

Also, the plurality of organic light-emitting layers for emitting the different-color light are partially overlapped so that the open area of the shadow mask is maximized in size, whereby the organic light-emitting layer of the OLED display device is manufactured with easiness.

Furthermore, as the microcavity with the good viewing angle properties is applied to the embodiments of the present invention, it is possible to realize the improved light efficiency and color properties.

According to the present invention, it is possible to increase the lifespan of the OLED display device by improving the light efficiency and color properties.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. An organic light emitting diode (OLED) display device, comprising:
    a substrate defined by a first pixel, a second pixel, a third pixel and a fourth pixel;
    a reflection layer deposited on the substrate, the reflection layer being a single layer including at least one of silver or aluminum;
    an anode electrode on the reflection layer;
    a light-absorbing layer formed between the reflection layer and the anode electrode in the second pixel;
    a cathode electrode of a semi-transparent metal material on the anode electrode, and
    an organic light-emitting layer between the anode electrode and the cathode electrode, the organic light-emitting layer comprising a first organic light-emitting layer that emits a first color light and a second organic light-emitting layer that emits a second color light different from the first color light,
    wherein the organic light-emitting layer in the first pixel consists of only the first organic light-emitting layer and emits the first color light,
    wherein the organic light-emitting layer in the second pixel consists of both the first organic light-emitting layer and the second organic light-emitting layer, and emits mixed light of the first color light and the second color light,
    wherein the organic light-emitting layer in the third pixel and the fourth pixel consist of only the second organic light-emitting layer, and emits the second color light, and
    wherein a material of the light-absorbing layer is different than that of the reflection layer.

2. The OLED display device of claim 1, wherein the mixed light of the first color light and the second color light has a white color.

3. The OLED display device of claim 2, wherein the first organic light-emitting layer emits a blue color light, the second organic light-emitting layer emits a yellow color light, and the mixed light corresponds to a white color light.

4. The OLED display device of claim 1, wherein the reflection layer and the cathode electrode are apart from each other.

5. The OLED display device of claim 1, further comprising a semi-transparent layer, on the light-absorbing layer of the second pixel.

6. The OLED display device of claim 1, further comprising a color refiner refining a light emitted in the organic light-emitting layer so that the refined light is displayed.

7. The OLED display device of claim 6, wherein the color refiner comprises a blue color refiner in the first pixel, a green color refiner in the third pixel, and a red color refiner in the fourth pixel.

8. The OLED display device of claim 7, wherein the green color refiner converts the second color light into a green color light, and the red color refiner converts the second color light into a red color light.

9. The OLED display device of claim 6, wherein the color refiner is formed on the cathode electrode.

10. The OLED display device of claim 6, wherein the reflection layer is positioned between the color refiner and the substrate.

11. The OLED display device of claim 1, further comprising a semi-transparent layer formed between the anode electrode and the light-absorbing layer in the second pixel.

12. The OLED display device of claim 1, wherein the light-absorbing layer has a reflectance less than 10% for wavelengths corresponding to the visible range.

13. The OLED display device of claim 1, wherein the reflection layer is directly on and in contact with the substrate.

14. A method for manufacturing an OLED display device, comprising:
  providing and defining a substrate by a first pixel, a second pixel, a third pixel and a fourth pixel;
  forming a reflection layer on the substrate, the reflection layer being a single layer including at least one of silver or aluminum;
  forming an anode electrode on the reflection layer;
  forming a light-absorbing layer between the reflection layer and the anode electrode, a material of the light-absorbing layer being different than that of the reflection layer;
  forming a cathode electrode of a semi-transparent metal material on the anode electrode, and
  forming an organic light-emitting layer between the anode electrode and the cathode electrode, the organic light-emitting layer comprising a first organic light-emitting layer that emits a first color light and a second organic light-emitting layer that emits a second color light different from the first color light,
  wherein the organic light-emitting layer in the first pixel consists of only the first organic light-emitting layer and emits the first color light,
  wherein the organic light-emitting layer in the second pixel consists of both the first organic light-emitting layer and the second organic light-emitting layer, and emits mixed light of the first color light and the second color light,
  wherein the organic light-emitting layer in the third pixel and the fourth pixel consist of only the second organic light-emitting layer, and emits the second color light.

15. The method of claim 14, wherein the first organic light-emitting layer and the second organic light-emitting layer are formed by a use of shadow mask.

16. The method of claim 15, wherein an open area included in the shadow mask is larger than an area of at least two of the first pixel, the second pixel, the third pixel and the fourth pixel.

17. The method of claim 14, further comprising forming a semi-transparent layer on the light-absorbing layer.

* * * * *